United States Patent
Chang et al.

[11] Patent Number: 5,923,519
[45] Date of Patent: Jul. 13, 1999

[54] SURGE PROTECTION DEVICE

[75] Inventors: Gil-Yong Chang, Suwon; Gun-Soo Yu, Seoul, both of Rep. of Korea

[73] Assignee: Samsung Electronics Co., Ltd., Suwon, Rep. of Korea

[21] Appl. No.: 09/006,673

[22] Filed: Jan. 13, 1998

[30] Foreign Application Priority Data

Mar. 21, 1997 [KR] Rep. of Korea ........................ 97-9818

[51] Int. Cl.⁶ .................................................. H02H 1/00
[52] U.S. Cl. ............................ 361/129; 361/111; 361/118
[58] Field of Search ................................... 361/111, 117, 361/118, 128, 120, 129, 130, 91; 313/325

[56] References Cited

U.S. PATENT DOCUMENTS

| | | | |
|---|---|---|---|
| 4,438,365 | 3/1984 | Atkinson | 313/325 |
| 4,620,126 | 10/1986 | Manske | 313/325 |
| 4,891,730 | 1/1990 | Saddow et al. | 361/111 |

*Primary Examiner*—Jeffrey Gaffin
*Assistant Examiner*—Michael J. Sherry
*Attorney, Agent, or Firm*—Dilworth & Barrese

[57] ABSTRACT

A surge protecting device for protecting circuit parts or electric power units of electronic devices from surges caused from exterior environments has a surge inflow terminal for receiving exterior surges from an antenna. The surge inflow terminal is interposed between surge absorption terminals which are connected to an A.C. power line so that the exterior surges cause a spark discharge to be generated in spark discharge gaps and be dissipated by flowing out through an A.C. ground pattern. The spark discharge gaps formed between the surge inflow terminal and the surge absorption terminals provide a predetermined distance therebetween. The device also includes cover members and mounts on a printed circuit board to allow the surge inflow and absorption terminals to be detachably assembled to terminal connection holes of the printed circuit board. The surge inflow and absorption terminals are arranged substantially parallel to each other.

13 Claims, 3 Drawing Sheets

SURGE PROTECTION DEVICE

BACKGROUND OF THE INVENTION

1. Field of the invention

The present invention relates to a surge protecting device for protecting circuits or electric power units of electronic devices from surges.

2. Description of the Related Art

Generally, electronic products, such as a television set or a VCR, have an antenna. It is possible for external surges caused by lightning, for example to cause a current surge into the electronic device. The surges flowing into an electric power unit or internal electronic parts of the electronic devices may cause damage or break-down in the devices.

Accordingly, it is advantageous to provide a proper measure to comply with safety rules to protect electronic devices against surges flowing into the devices.

Referring to FIG. 1, a prior art schematic circuit diagram illustrates the construction of an electronic product having a protective device for protecting against surges.

As shown in FIG. 1, a surge protecting device 10 is formed on a printed circuit board 20 with a T-shaped gap 11 having a crevice of a predetermined distance t therein, and device 10 is provided with a surge inflow terminal 12 and surge absorption terminals 104 and 116 made of a plurality of copper pieces sized to fit in the gap 11. The device 10 is patterned on printed circuit board 20.

The surge inflow terminal 12 is typically disposed at the center of the device 10 to be connected to an antenna 50, and the surge absorption terminals 104 and 116 are arranged such that gap 11 separates terminals 104 and 116 from each other and from the surge inflow terminal 12. Terminals 104 and 116 connect to alternating current (A.C.) wires 30 and 40, respectively.

When the surges caused by an event, for example, a lightning strike flow into the surge inflow terminal 12 through the antenna 50, a spark is generated in the gap 11 between the surge absorption terminals 104 and 116. An arc discharge generated in the gap 11 results in converting part of the surge energy into heat to be dissipated in air, and the rest of the energy is dissipated in a ground through an A.C. electric power line 40.

Even though overvoltage is generated between terminals of the A.C. electric power lines 30 and 40, the surge absorption terminals 104 and 116, connected with the lines 30 and 40, are normally designed to be insulated therebetween. When an arc caused by the overvoltage is generated, the energy of the overvoltage is dissipated through the power line 40, thereby protecting internal circuit elements of the electronic devices from damage.

However, there is a problem in the prior art surge protection device 10. Though it is low in cost, when it is made of a copper foil on the printed circuit board 20, flux left by soldering frequently remains on the printed circuit board 20 thereby making it difficult to create a spark discharge in the gap between the surge absorption terminals 104 and 116.

When the surges are continuously received in the surge inflow terminal 12 through the antenna 50, the copper foils on the printed circuit board 10 may burn, and a spark discharge cannot be generated, or the device fails to perform as a surge absorption device.

When the surge protector is damaged, it is inconvenient for a user to repair it because the entire printed circuit board 20 must be replaced, thereby increasing cost. Therefore, a need exists for a surge protection device for electronic devices, in which the surge protection device can withstand a multiplicitity of surges.

A conventional device 10 for protecting electronic parts against surges was tested. One model of a prior art device is model LSS-15SC manufactured by Noise Company. This model was tested by repeatedly applying negative voltage to an antenna terminal instead of an exterior surge from lightning. The results of the test are as follows in Table 1:

TABLE 1

| Voltage(KV) | The number of times voltage was applied | Result of Failure | Part damaged | Note |
|---|---|---|---|---|
| 5 | 1(first) | no power | IC803 (for standby) | |
| 6 | 1(first) | no power | IC803 | |
| 7 | 2(second) | no power | IC803, D802 | |
| 8 | 2(second) | no power | IC803 | |
| 9 | 1(first) | no power | IC803 | |
| 10 | 1(first) | power-off | none | normal at the start of power-on |
| | 2(second) | no power | F802(fuse), IC803 | |
| 11 | 1(first) | no power | F802 | |
| 12 | filter of the inside line of an A.C. electric cord burnt | | | |
| 13 | 1(first) | no power | F802 | |

From the results of the test, it was found that circuit devices are not well protected from surges and easily broken down at the first stage of the test.

SUMMARY OF THE INVENTION

It is an object of the present invention to provide a surge protection device which includes a surge inflow terminal and surge absorption terminals, which are connected to ends of an antenna and an A.C. electric power line respectively, are arranged so that a spark discharge is easily generated and are detachably assembled to a circuit board to be easily replaced if the surge protection device gets damaged.

In accordance with the object of the present invention, there is provided a surge protection device comprising a surge inflow terminal for receiving exterior surges from an antenna; surge absorption terminals connecting to an A.C. power line so that the exterior surges cause a spark discharge to be generated in spark discharge gaps and be dissipated by flowing out through an A.C. ground pattern, said spark discharge gaps spaced apart at a predetermined distance from both sides of the surge inflow terminal; and cover members mounted on a printed circuit board to allow the surge inflow and absorption terminals to be detachably assembled to terminal connection holes of the printed circuit board, said surge inflow and absorption terminals arranged substantially parallel to each other.

BRIEF DESCRIPTION OF THE DRAWINGS

For a fuller understanding of the nature and object of the invention, reference is made to the following detailed description made in conjunction with the accompanying drawings in which.

DETAILED DESCRIPTION OF PREFERRED EMBODIMENTS OF THE INVENTION

Figure 1:
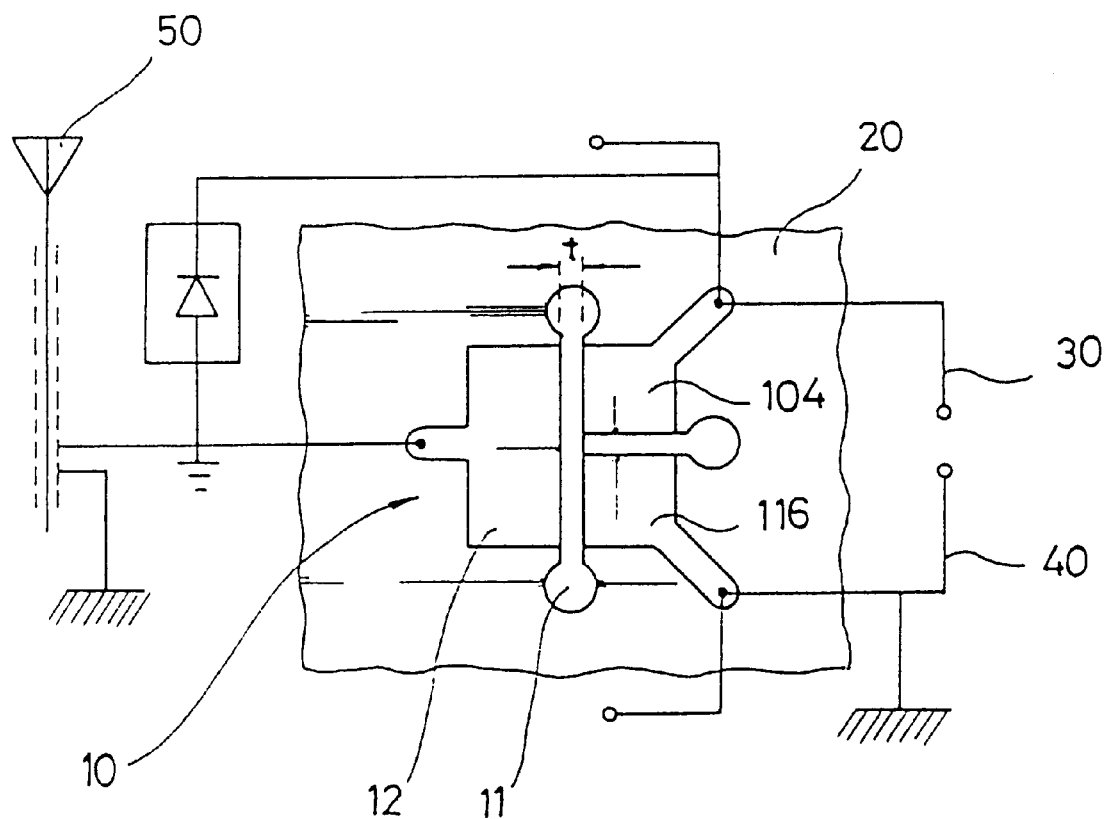
FIG. 1 is a schematic circuit diagram illustrating a prior art electronic device having a surge protection device.

The following is a detailed description of preferred embodiments of a surge protection device according to the present invention with reference to the accompanying drawings.

Throughout the drawings, like reference numerals and symbols are used for designation of like or equivalent parts or portions as in FIGS. 1 through 4.

Figure 2:
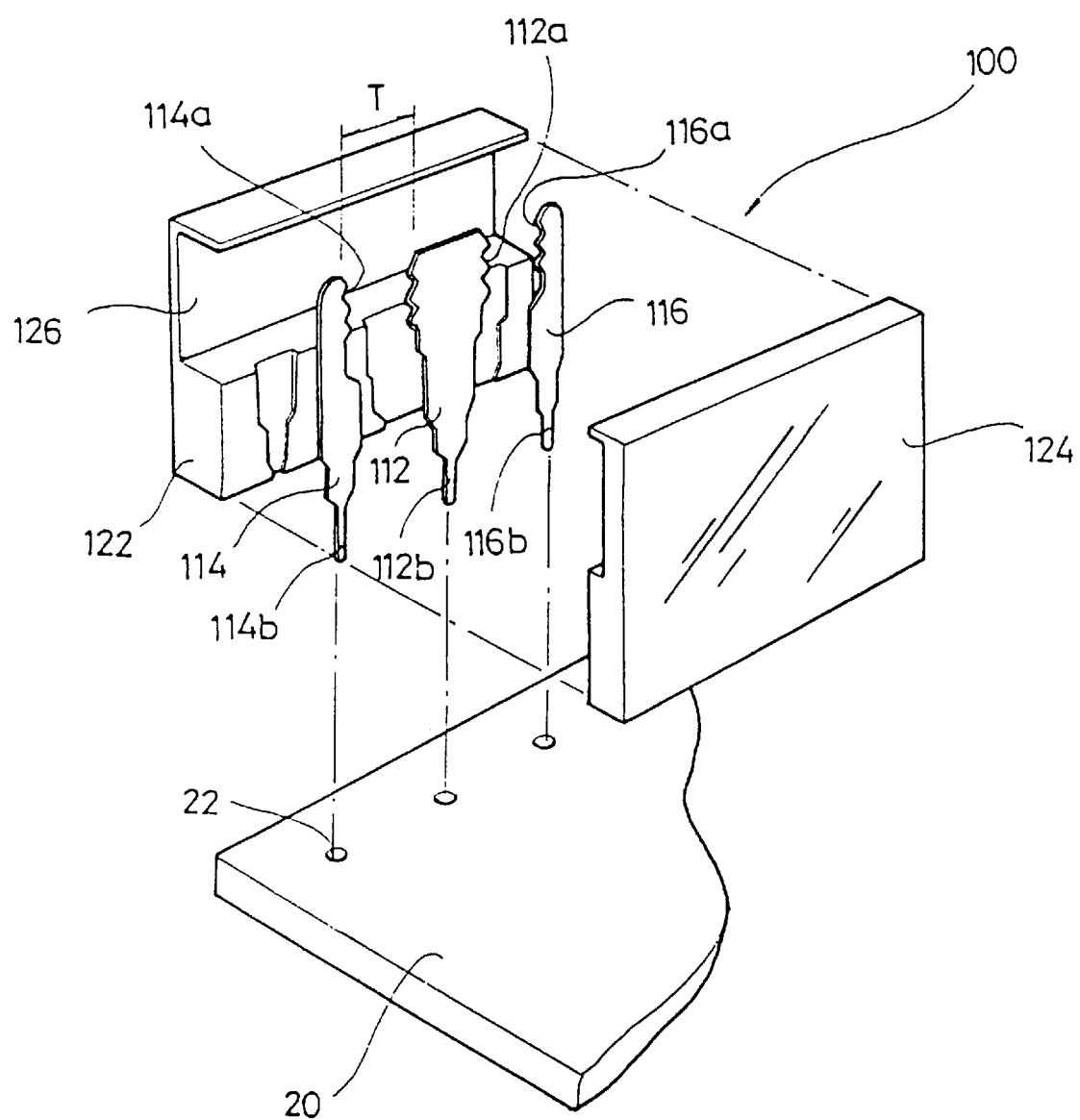
FIG. 2 is an exploded perspective view of a surge protection device according to the present invention.
Figure 3:
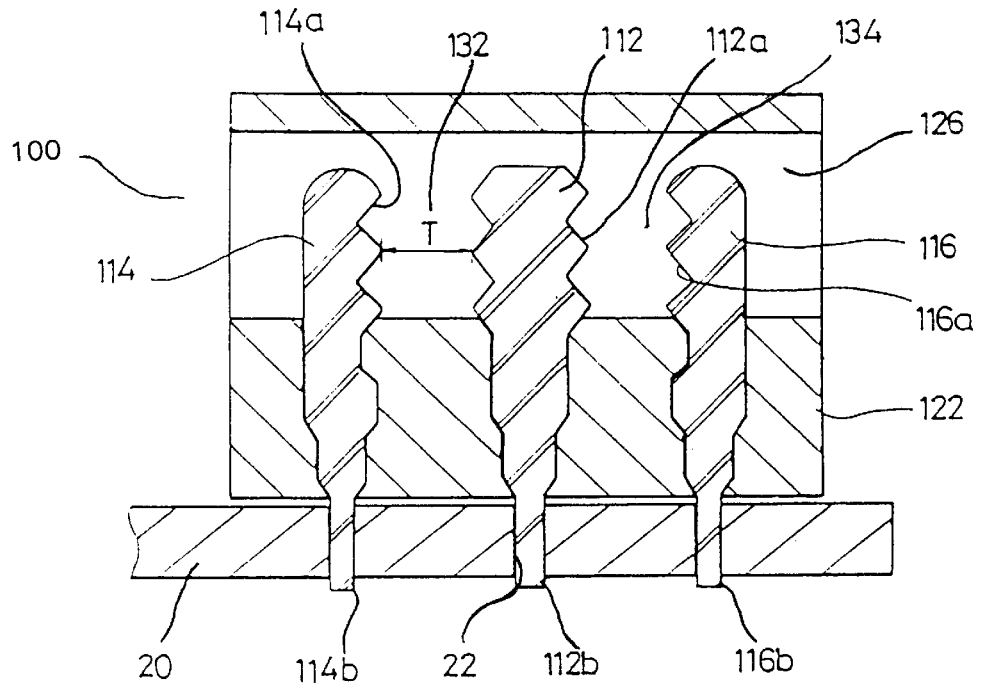
FIG. 3 is an assembled sectional view of a surge protection device according to the present invention.

Reference numeral 100 in FIGS. 2 and 3 represents a surge protection device, the device includes two cover members 122 and 124, a surge inflow terminal 112 and surge absorption terminals 114 and 116 arranged substantially parallel to one another at a predetermined distance, T, of gaps 132 and 134 for spark discharge. The device 100 is enclosed by the cover members 122 and 124.

The terminals 112, 114 and 116 are form, at their upper edges, saw-toothed portions 112a, 114a and 116a respectively, and at their lower sides with connection portions 112b, 114b and 116b. The saw-toothed portions 112a, 114a and 116a face each other and connection portions 112b, 114b and 116b are projected toward the printed circuit board 20.

The connection portions 112b, 114b and 116b of the terminals 112, 114 and 116 are inserted into terminal connection holes 2 of the printed circuit board 20 to be detachably assembled thereto.

Width T of the gaps 132 and 134 is about 6mm at the terminal connection holes 22. This width conforms to a safety rule known to those skilled in the art, and the terminals 112, 114 and 116 may have a thickness of about 0.4 mm.

It is preferable that each of the saw-toothed portions 112a, 114a and 116a have two or more saw teeth. Saw teeth permit a spark discharge to be more easily generated and the expected life span of terminals 112, 114 and 116 may be expanded by increasing the number of saw teeth.

Further, it is preferable that the surge inflow terminal 112 and the surge absorption terminals 114 and 116 be made of an alloy of Ni-Sn based material to have durability against repeated electric discharge. This provides greater durability than copper foil.

It is also preferable that a through hole 126 be formed at both the upper insides of the cover members 122 and 124, that is, at which the saw-toothed portions 112a, 114a and 116a are occupied, to discharge gases generated by a spark discharge therebetween.

Furthermore, the cover members 122 and 124 may be made of synthetic resins, such as a transparent acrylic resin, to observe with the naked eye whether there is any defect in the surge inflow terminal 112 and the surge absorption terminals 114 and 116.

Figure 4:
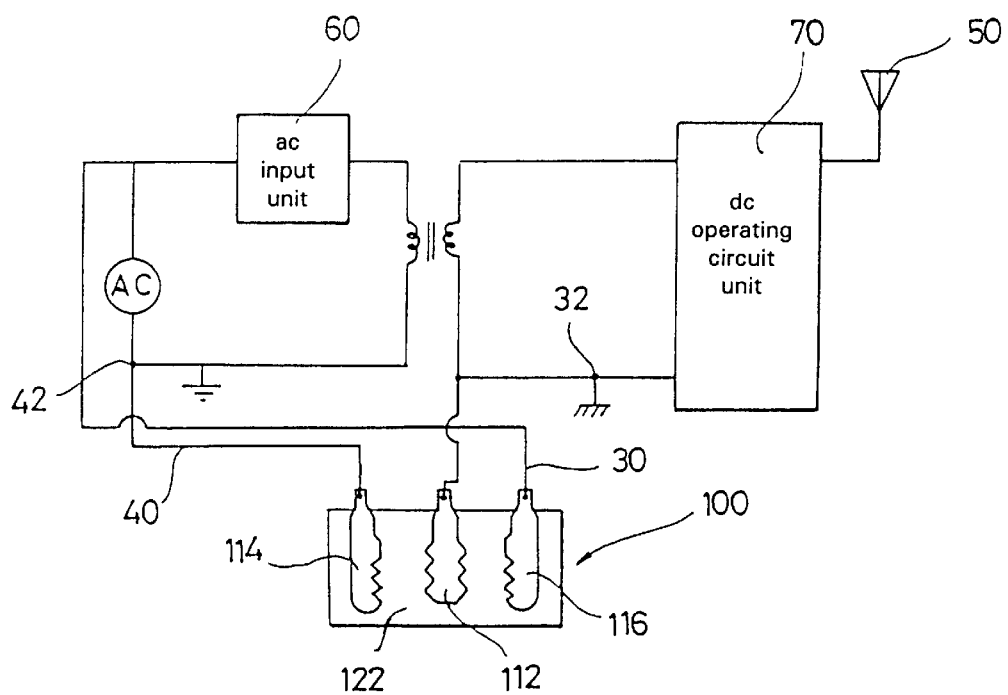
FIG. 4 is a schematic circuit diagram of an electronic device having a surge protection device according to the present invention.

Referring to FIG. 4, an A.C. input unit 60, which inputs an A.C. power to internal elements of an electronic device, includes an A.C. ground pattern 42. The A.C. ground pattern 42 is grounded through an A.C. power line 40. A D.C. ground pattern 32 is electrically floated in a D.C. operating circuit unit 70 operated by a D.C. voltage. The D.C. voltage may be produced by an A.C. voltage of the A.C. input unit 60 that is rectified by a rectifier.

Accordingly, exterior surges caused by lightning arrive at the surge inflow terminal 112 through the antenna 50, that is, impulse signals, flow via the D.C. ground pattern 32 and allow an arc to be generated to discharge in the gaps 132 and 134 of the device 100 (FIG. 3). The arc discharge causes air to be heated and ionized. Then, a portion of transient energy is dissipated as heat, and another portion of the transient energy is dissipated by flowing out the A.C. ground pattern 42 through the A.C. power line 40 of the surge absorption terminals 114 and 116.

Gases generated during the arc discharge are discharged through the through hole 126. In addition, the cover members 122 and 124 serve to tightly seal the terminals 112, 114 and 116, and prevent nearby circuit elements from being broken down by a spark flame.

Since the surge inflow terminal 112 and the surge absorption terminals 114 and 116 have the saw-toothed portions 112a, 114a and 116a, respectively, at their opposing edges, the arc discharge is more easily generated. Further, the surge inflow terminal 112 and the surge absorption terminals 114 and 116 are provided at their lower side with the connection portions 112b, 114b and 116b in the form of protrusions for insertion into the connection holes 22, so that it is convenient and easy to assemble or disassemble terminal 112 and the surge absorption terminals 114 and 116 from the printed circuit board 20.

Accordingly, the surge protection device 100 according to the present invention is not formed on the printed circuit board 20 (FIG. 2) with a copper foil, but instead is installed on the printed circuit board 20 with an alloy such that the device 100 may be detachably assembled, so that it is possible to conveniently exchange or repair the device 100 without exchanging the printed circuit board 20 when the device 100 gets damaged or needs replacing.

As shown in the following test results of Table 2, slight damage occurred, such as a fuse blow-out, but heavy damage was remarkably decreased in the internal circuit elements of an electronic device. The test was performed under the same conditions as that of the aforementioned test with results shown in Table 1.

TABLE 2

| Voltage(KV) | The number of times voltage was applied | Result of Failure | Part damaged | Note |
| --- | --- | --- | --- | --- |
| 5 | 1–10 | power-off | none | normal at the start of power-on |
| 6 | 1–10 | power-off | none | normal at the start of power-on |
| 7 | 3(third) | no power | IC803 | |
| 8 | 1–10 | power-off | none | normal at the start of power-on |
| 9 | 8(eighth) | no power | F802(fuse) | spark occurred |
| 10 | 1(first) | no power | F802(fuse) | |
| 11 | 1(first) | no power | F802(fuse) | |
| 12 | 1(first) | no power | F802(fuse) | |
| 13 | 3(third) | no power | IC803 | |
| 14 | 3(third) | no power | F802 | |
| 15 | 1(first) | no power | . . . F802 | |

From the foregoing results, it is apparent that the device according to the present invention provides advantages over the prior art device. Since the device can be manufactured to be detachably assembled to a printed circuit board, it is convenient to exchange or repair it without replacing the printed circuit board itself, damage of the device is remarkably reduced even in the presence of continuously flowing surges, and circuit elements of an electronic product are effectively protected by maintaining a uniform spark discharge.

While the present invention has been shown and described in connection with the preferred embodiments, it will be apparent to those of ordinary skill in the art that many changes and modifications may be made without departing from the spirit and scope of the invention as defined in the appended claims.

What is claimed is:

1. A surge protection device comprising:

a surge inflow terminal for receiving exterior surges from an antenna;

first and second surge absorption terminals connected to an A.C. power line such that the exterior surges cause a spark discharge to be generated in spark discharge gaps and be dissipated by flowing out through an A.C. ground pattern, said surge inflow terminal being interposed between said first and second surge absorption terminals with said surge inflow and absorption terminals being arranged substantially parallel to each other, said spark discharge gaps formed between said surge inflow terminal and said surge absorption terminals being substantially parallel to each other and providing a predetermined distance therebetween; and cover members enclosing said terminals with at least a portion of said terminals extending beyond said cover members to allow the surge inflow and absorption terminals to be inserted into terminal connection holes of a printed circuit board.

2. The device as recited in claim 1, wherein the surge inflow terminal and the surge absorption terminals each have saw-toothed portions, each portion formed on opposing edges of each of the surge inflow terminal and the surge absorption terminals to allow the exterior surges to be easily dissipated across the gaps therebetween.

3. The device as recited in claim 2, wherein the saw-toothed portions have at least three saw teeth to provide durability to endure continuous spark discharge.

4. The device as recited in claim 1, wherein the surge inflow terminal and the surge absorption terminals are made of an alloy of Ni-Sn based material.

5. The device as recited in claim 1, wherein the cover members form a through hole to allow gases generated during the spark discharge to be discharged therethrough.

6. The device as recited in claim 1, wherein the cover members are made of a transparent synthetic resin to permit visual inspection to determine if the surge inflow terminal and the surge absorption terminals have a defect.

7. A surge protection device comprising:

surge inflow terminal means for receiving exterior surges;

surge absorption terminal means for connecting to an A.C. power line such that the exterior surges cause a spark discharge to be generated in a spark discharge gap and be dissipated by flowing out through an A.C. ground, said surge inflow means being interposed between said surge absorption terminal means with said spark discharge gap formed between said surge inflow terminal means and said surge absorption terminal means providing a predetermined distance therebetween, said surge inflow terminal means and absorption terminal means arranged substantially parallel to each other; and surge inflow terminal means and surge absorption terminal means each having opposing edges adjacent to the gap therebetween, said opposing edges having saw-toothed portions formed thereon for allowing external surges to be more easily dissipated between the gap.

8. The surge protection device as recited in claim 7, wherein external surges are received at the surge inflow terminal means through an antenna.

9. The surge protection device as recited in claim 7, wherein the surge inflow terminal means and the surge absorption terminal means are electrodes made of an alloy of Ni-Sn based material.

10. The surge protection device as recited in claim 7, wherein the surge inflow terminal means and the surge absorption terminal means are partially enclosed by cover members.

11. The surge protection device as recited in claim 10, wherein the cover members are made from a transparent material for permitting visual inspection of the surge inflow terminal means and the surge absorption terminal means.

12. The surge protection device as recited in claim 7, wherein the surge inflow terminal means and the surge absorption terminal means are detachably connected to a printed circuit board.

13. The surge protection device as recited in claim 7, wherein the saw-toothed portions have at least three saw teeth to provide durability to endure continuous spark discharge .

* * * * *